US008514640B2

(12) United States Patent
Miakashi et al.

(10) Patent No.: US 8,514,640 B2
(45) Date of Patent: Aug. 20, 2013

(54) NONVOLATILE SEMICONDUCTOR MEMORY DEVICE

(75) Inventors: Makoto Miakashi, Kanagawa-ken (JP); Katsuaki Isobe, Kanagawa-ken (JP); Noboru Shibata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 291 days.

(21) Appl. No.: 13/036,525

(22) Filed: Feb. 28, 2011

(65) Prior Publication Data
US 2011/0211395 A1 Sep. 1, 2011

(30) Foreign Application Priority Data

Feb. 26, 2010 (JP) .................................. 2010-042980

(51) Int. Cl.
*G11C 7/00* (2006.01)
(52) U.S. Cl.
USPC ........... 365/196; 365/219; 365/220; 365/221; 365/205; 365/207
(58) Field of Classification Search
USPC .................. 365/219, 220, 221, 196, 205, 207
See application file for complete search history.

(56) References Cited

U.S. PATENT DOCUMENTS

| 7,551,466 B2 * | 6/2009 | Aritome | 365/63 |
|---|---|---|---|
| 2003/0048689 A1 * | 3/2003 | Kim | 365/230.06 |
| 2008/0037309 A1 * | 2/2008 | Makino | 365/63 |

FOREIGN PATENT DOCUMENTS

| JP | 5-210999 A | 8/1993 |
|---|---|---|
| JP | 7-122092 A | 5/1995 |
| JP | 9-180483 A | 7/1997 |
| JP | 11-260078 A | 9/1999 |
| JP | 11-283365 A | 10/1999 |
| JP | 11-283386 A | 10/1999 |
| JP | 2002-279788 A | 9/2002 |
| JP | 2002-324400 A | 11/2002 |
| JP | 2002-329400 A | 11/2002 |
| JP | 2003-204001 A | 7/2003 |
| JP | 2004-5999 | 1/2004 |

(Continued)

OTHER PUBLICATIONS

Office Action issued Jan. 29, 2013 in Japanese Patent Application No. 2010-042980 (English-language translation only).

*Primary Examiner* — Vu Le
*Assistant Examiner* — Han Yang
(74) *Attorney, Agent, or Firm* — Oblon, Spivak, McClelland, Maier & Neustadt, L.L.P.

(57) ABSTRACT

A semiconductor memory device, in which interference between adjoining cells can be reduced and an expansion of a chip area can be suppressed, comprising: a memory cell array in which plural memory cells connected to plural word lines and plural bit lines are disposed in a matrix form; sense amplifiers each of which is to be connected to each of the bit lines; a control circuit which controls voltages of the word lines and the bit lines, and programs data into the memory cells or reads data from the memory cells; wherein the plural bit lines include at least a first, a second, a third and a fourth bit lines adjoining to each other, and the sense amplifiers include at least a first and a second sense amplifiers, a first and a fourth selection transistors which are provided between the first and the fourth bit lines and the first sense amplifier, and connect the first and the fourth bit lines to the first sense amplifier; and a second and a third selection transistors which are provided between the second and the third bit lines and the second sense amplifier, and connect the second and the third bit lines to the second sense amplifier.

18 Claims, 10 Drawing Sheets

(56) References Cited

FOREIGN PATENT DOCUMENTS

| | | |
|---|---|---|
| JP | 2005-25898 A | 1/2005 |
| JP | 2007-4969 A | 1/2007 |
| JP | 2007-517353 A | 6/2007 |
| JP | 2007-226952 A | 9/2007 |
| JP | 2008-257781 A | 10/2008 |
| JP | 2009-43397 A | 2/2009 |
| JP | 2009-54246 A | 3/2009 |
| JP | 2009-252293 A | 10/2009 |
| JP | 2010-520575 A | 6/2010 |
| JP | 2010-538409 A | 12/2010 |
| WO | WO 2009/032747 A1 | 3/2009 |

* cited by examiner

US 8,514,640 B2

NONVOLATILE SEMICONDUCTOR MEMORY DEVICE

CROSS-REFERENCE TO RELATED APPLICATION

This application is based upon and claims the benefit of priority from the prior Japanese Patent Application No. P2010-42980, filed on Feb. 26, 2010, the entire contents of which are incorporated herein by reference.

BACKGROUND OF THE INVENTION

1. Field of the Invention

The present invention relates to a semiconductor memory device, for example, a NAND type flash memory.

2. Description of the Related Art

The NAND type flash memory has two kinds of programming or reading systems. First, there is an Even/Odd system (hereinafter, referred to as an E/O system) in which even cells and odd cells of plural cells connected to a selected word line are selected alternately and the halves of the plural cells are connected to corresponding bit lines alternately. Secondly, there is an All Bit Line system (hereinafter, referred to as an ABL system) in which all plural cells connected to a selected word line are connected to corresponding bit lines and data are collectively programmed or read.

In the E/O system, since the cells connected to the odd and even bit lines cannot be programmed simultaneously, a pair programming operation cannot be carried out. For this reason, there is a problem that probability that a threshold value is changed by coupling with adjoining cells is increased.

In the ABL system, although both operations of the pair programming and an even/odd programming can be carried out, a chip area is expanded and also a consumed current is increased because it is necessary to connect a sense amplifier to each bit line.

Incidentally, as a related art, there is an art that a bit line connected to a sense amplifier 1 and a bit line connected to a sense amplifier 2 are disposed alternately, and thereby noise due to capacitive coupling between the bit lines is reduced.

BRIEF SUMMARY OF THE INVENTION

An aspect of a semiconductor memory device of the invention intends to provide a semiconductor memory device which can reduce interference between adjoining cells and can suppress an expansion of the chip area.

The aspect of the semiconductor memory device of the invention includes: a memory cell array in which plural memory cells connected to plural word lines and plural bit lines are disposed in a matrix form; sense amplifiers each of which is to be connected to each of the bit lines; a control circuit which controls voltages of the word lines and the bit lines, and programs data into the memory cells or reads data from the memory cells; wherein the plural bit lines include at least a first, a second, a third and a fourth bit lines adjoining to each other, and the sense amplifiers include at least a first and a second sense amplifiers, a first and a fourth selection transistors which are provided between the first and the fourth bit lines and the first sense amplifier, and connect the first and the fourth bit lines to the first sense amplifier; and a second and a third selection transistors which are provided between the second and the third bit lines and the second sense amplifier, and connect the second and the third bit lines to the second sense amplifier.

DETAILED DESCRIPTION OF THE INVENTION

An embodiment of the invention will hereinafter be explained with reference to drawings.

Figure 1:
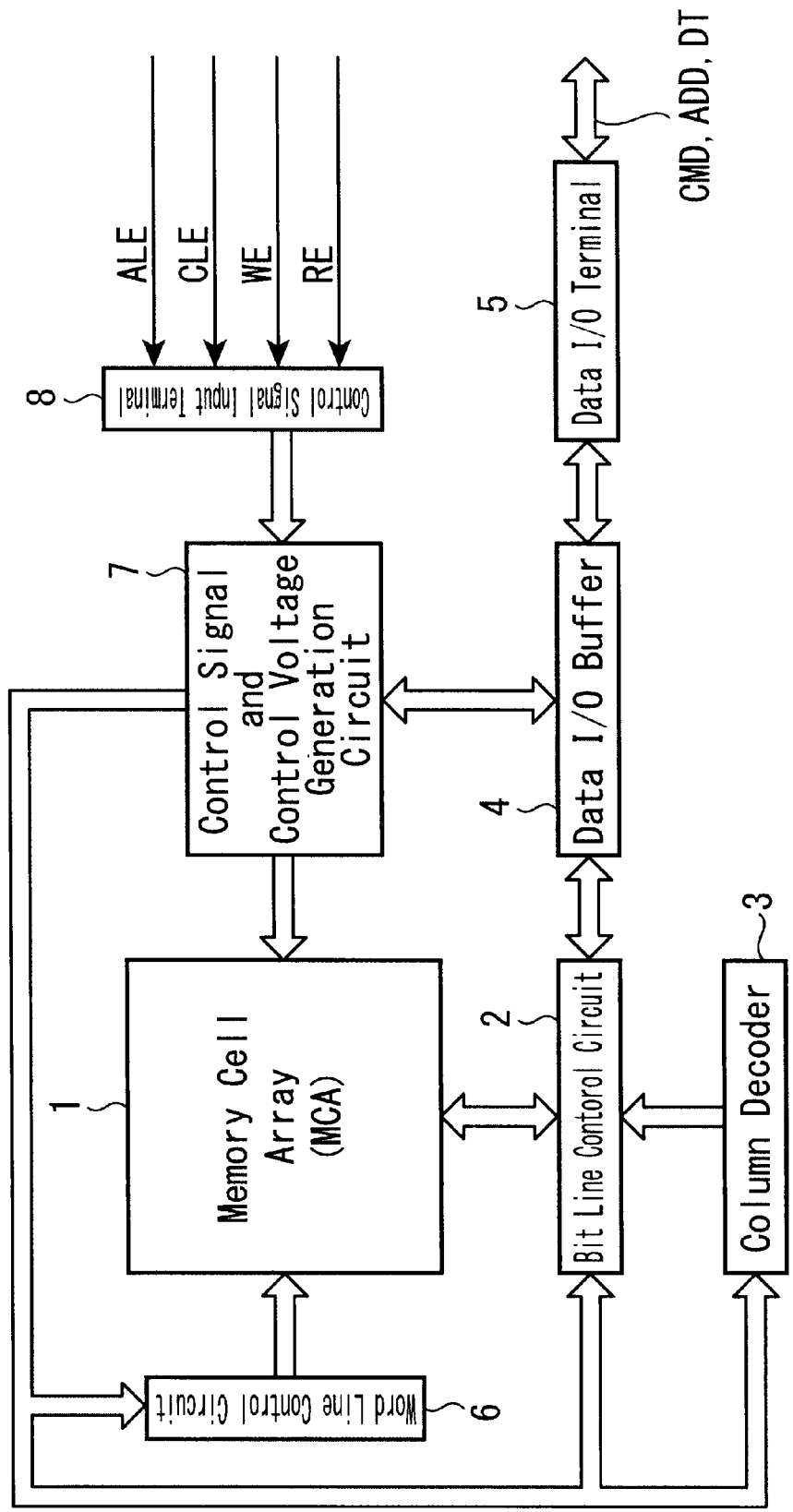
FIG. 1 is a configuration diagram showing one example of a semiconductor memory device applied to an embodiment of the invention.

FIG. 1 shows a configuration of a semiconductor memory device applied to the embodiment of the invention, for example, a NAND type flash memory which can memorize four values (two bits).

A memory cell array 1 includes plural bit lines, plural word lines and a common source line, in which memory cells each of which includes, for example, an EEPROM cell and can rewrite data electrically are disposed in a matrix form. A bit line control circuit 2 for controlling the bit lines and a word line control circuit 6 are connected to this memory cell array 1.

The bit line control circuit 2 reads data of the memory cell in the memory cell array 1 through the bit line, detects a state of the memory cell in the memory cell array 1 through the bit line, and programs the memory cell by applying a programming control voltage to the memory cell in the memory cell array 1 through the bit line. A column decoder 3 and a data input/output buffer 4 are connected to the bit line control circuit 2. A data memory circuit in the bit line control circuit 2 is selected by the column decoder 3. Data of the memory cell read to the data memory circuit is outputted from a data input/output terminal 5 to the outside through the data input/output buffer 4. The data input/output terminal 5 is connected to, for example, a host which is outside a memory chip and is not shown. This host is configured with, for example, a microcomputer, and receives the data outputted from the data input/output terminal 5. Furthermore, the host outputs various commands CMD which control an operation of the NAND type flash memory, an address ADD and data DT. Programming data inputted into the data input/output terminal 5 from the host is supplied to the data memory circuit selected by the column decoder 3 through the data input/output buffer 4, and the command and the address are supplied to a control signal and control voltage generation circuit 7.

The word line control circuit 6 is connected to the memory cell array 1. This word line control circuit 6 selects the word line in the memory cell array 1, and applies a voltage required for reading, programming or erasure to the selected word line.

The memory cell array 1, bit line control circuit 2, column decoder 3, data input/output buffer 4 and word line control circuit 6 are connected to the control signal and control voltage generation circuit 7, and are controlled by this control signal and control voltage generation circuit 7. The control signal and control voltage generation circuit 7 is connected to a control signal input terminal 8, and is controlled by control signals ALE (address latch enable), CLE (command latch enable), WE (write enable) and RE (read enable) inputted through the control signal input terminal 8 from the host.

The bit line control circuit 2, column decoder 3, word line control circuit 6 and control signal and control voltage generation circuit 7 configure a programming circuit, reading circuit and erasing circuit.

Figure 2:
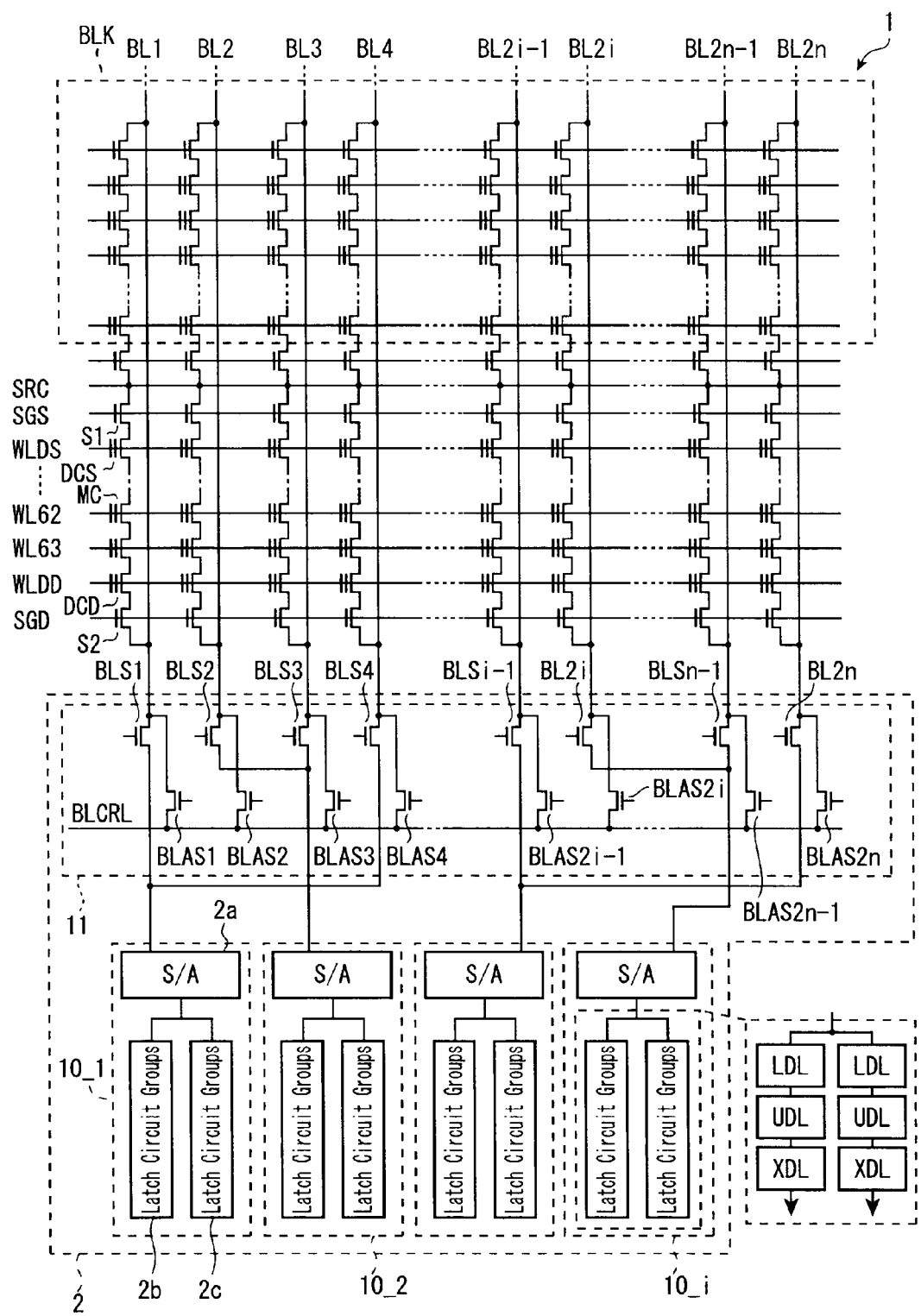
FIG. 2 is a circuit diagram showing one example of a memory cell array and a bit line control circuit shown in FIG. 1.

FIG. 2 shows configurations of the memory cell array 1 and the bit line control circuit 2 in FIG. 1.

Plural NAND strings are disposed in the memory cell array 1. One NAND string is configured with memory cells MC including, for example, 64 EEPROMs connected in series, dummy cells DCS, DCD, and selection gates S1, S2. The selection gate S2 is connected to a bit line BL1, and the selection gate S1 is connected to a source line SRC. The other NAND strings are connected to bit lines BL2 ... and the source line SRC. Control gates of memory cells MC disposed in each row are connected to the word lines WL0-WL63 (WL0 is not shown) in common, and the dummy cells DCS, DCD are connected to dummy word lines WLDS, WLDD respectively. In addition, the selection gates S2 are connected to a select line SGD in common, and the selection gates S1 are connected to a select line SGS in common.

The bit line control circuit 2 has a bit line selection circuit 11 and plural data memory circuits 10_1, 10_2 ... 10_i. The respective data memory circuits 10_1, 10_2 ... 10_i are connected to the corresponding bit lines BL1, BL2, BL3, BL4, ... through the bit line selection circuit 11.

The bit line selection circuit 11 connects four adjoining bit lines to two data memory circuits selectively. A bit line selection transistor and a bias transistor are connected to each bit line. For example, to the bit lines BL1, BL2, BL3, BL4, one ends of current paths of the bit line selection transistors BLS1, BLS2, BLS3, BLS4 are connected respectively, and one ends of the current paths of the bias transistors BIAS1, BIAS2, BIAS3, BIAS4 are connected respectively. The other ends of the current paths of the bias transistors BIAS1, BIAS2, BIAS3, BIAS4 are connected in common to an interconnection to which a signal BLCRL is supplied.

In addition, the other ends of the current paths of the bit line selection transistors BLS1, BLS4 are connected to the data memory circuit 10_1, and the other ends of the current paths of the bit line selection transistors BLS2, BLS3 are connected to the data memory circuit 10_2. Relationships between the other bit line selection transistors and the other data memory circuits are the same as that stated above.

A signal outputted from the control signal and control voltage generation circuit 7 is supplied to each gate of the bit line selection transistors BLS1-BLS2$n$ and the bias transistors BIAS1-BIAS2$n$.

The data memory circuits 10_1, 10_2 ... 10_i are each configured with a sense amplifier (S/A) 2a and latch circuit groups 2b, 2c. The sense amplifier 2a detects data read from the memory cell. The latch circuit groups 2b, 2c are connected to the sense amplifier 2a in parallel. The latch circuit groups 2b, 2c each have, for example, three latch circuits LDL, UDL, XDL. Each latch circuit LDL, UDL, XDL holds data to be programmed into the memory cell, and holds data which is read from the memory cell and detected by the sense amplifier 2a. The latch circuit XDL among of them is connected to the data input/output buffer 4, and holds input/output data.

Each of the sense amplifier 2a and the latch circuit groups 2b, 2c is controlled by the column decoder 3 and the control signal and control voltage generation circuit 7 shown in FIG. 1.

In FIG. 2, the data memory circuit is configured with the latch circuit groups 2b, 2c, but is not limited to this. For example, the number of the latch circuit groups can be increased depending on the bit number of data to be programmed into the memory cell.

Generally, in the E/O system, the bit lines BL1 and BL2 are connected to the sense amplifier 2a of the data memory circuit 10_1, and the bit lines BL3 and BL4 are connected to the sense amplifier 2a of the data memory circuit 10_2. For this reason, the even/odd programming can be carried out in which the bit lines BL2 and BL4 are selected and programming is carried out after the bit lines BL1 and BL3 are selected and programming is carried out. The pair programming, however, cannot be carried out in which the bit lines BL3 and BL4 are selected and programming is carried out after the bit lines BL1 and BL2 are selected and programming is carried out because adjoining bit lines are connected to an identical sense amplifier.

As shown in FIG. 2, however, according to this embodiment, both of the even/odd programming and the pair programming can be realized. The even/odd programming can be carried out by, for example, turning on the bit line selection transistors BLS2 and BLS4, turning off the bit line selection transistors BLS1 and BLS3 and carrying out programming, after turning on the bit line selection transistors BLS1 and BLS3, turning off the bit line selection transistors BLS2 and BLS4 and carrying out programming.

In addition, the pair programming can be carried out by turning on the bit line selection transistors BLS3 and BLS4, turning off BLS1 and BLS2 and carrying out programming, after turning on the bit line selection transistors BLS1 and BLS2, turning off BLS3 and BLS4 and carrying out programming.

In this way, according to this embodiment, both of the even/odd programming and the pair programming can be carried out.

Next, details of programming and verify operations and a relationship between the data latch circuit groups will be explained with reference to FIG. 3A, FIG. 3B, FIG. 4 and FIG. 5.

In this embodiment, a case where binary data are memorized will be explained in order to simplify the explanation. When data are programmed, the latch circuit LDL in, for example, the latch circuit group 2b of the data memory circuit 10_1 holds data to be programmed into the memory cell connected to the first bit line BL1, and the latch circuit LDL in, for example, the latch circuit group 2b of the data memory circuit 10_2 holds data to be programmed into the memory cell connected to the third bit line BL3. In addition, the latch circuit LDL in, for example, the latch circuit group 2c of the data memory circuit 10_1 holds data to be programmed into the memory cell connected to the fourth bit line BL4, and the latch circuit LDL in, for example, the latch circuit group 2c of the data memory circuit 10_2 holds data to be programmed into the memory cell connected to the second bit line BL2.

Figure 3:
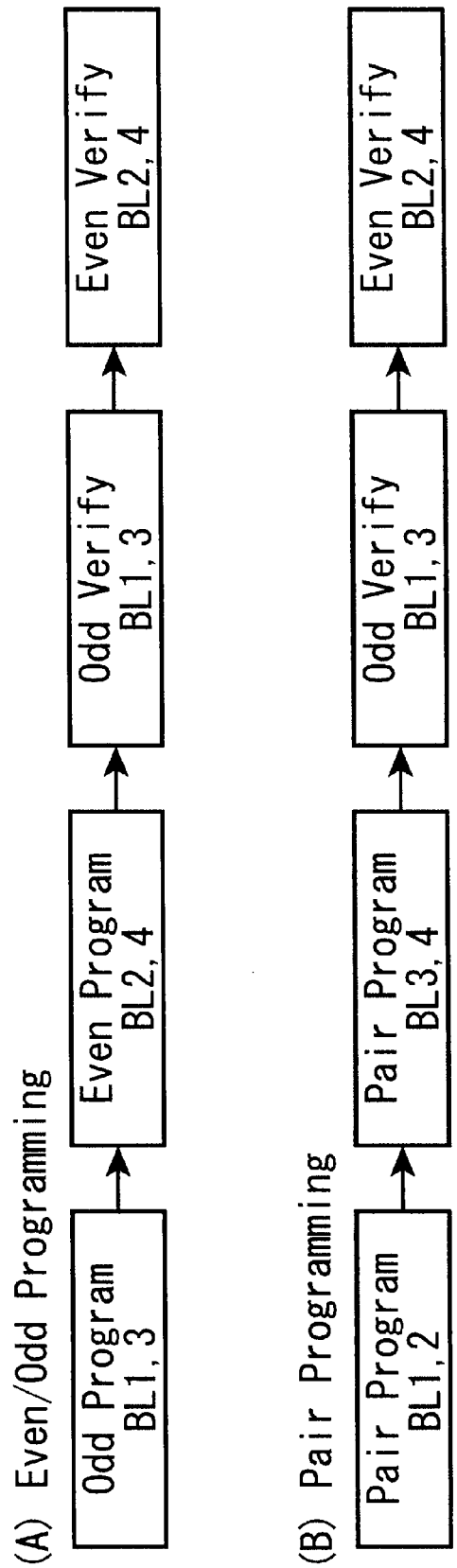
FIG. 3A is a view schematically showing an even/odd programming and a verify operation in the embodiment.
FIG. 3B is a view schematically showing a pair programming and a verify operation in the embodiment.

As shown in FIG. 3A, in the even/odd programming, odd programming is carried out by selecting odd bit lines BL1 and BL3 first, and even programming is carried out next by selecting even bit lines BL2 and BL4.

Odd verification is then carried out by selecting the odd bit lines BL1 and BL3, and even verification is carried out next by selecting the even bit lines BL2 and BL4.

Figure 4:
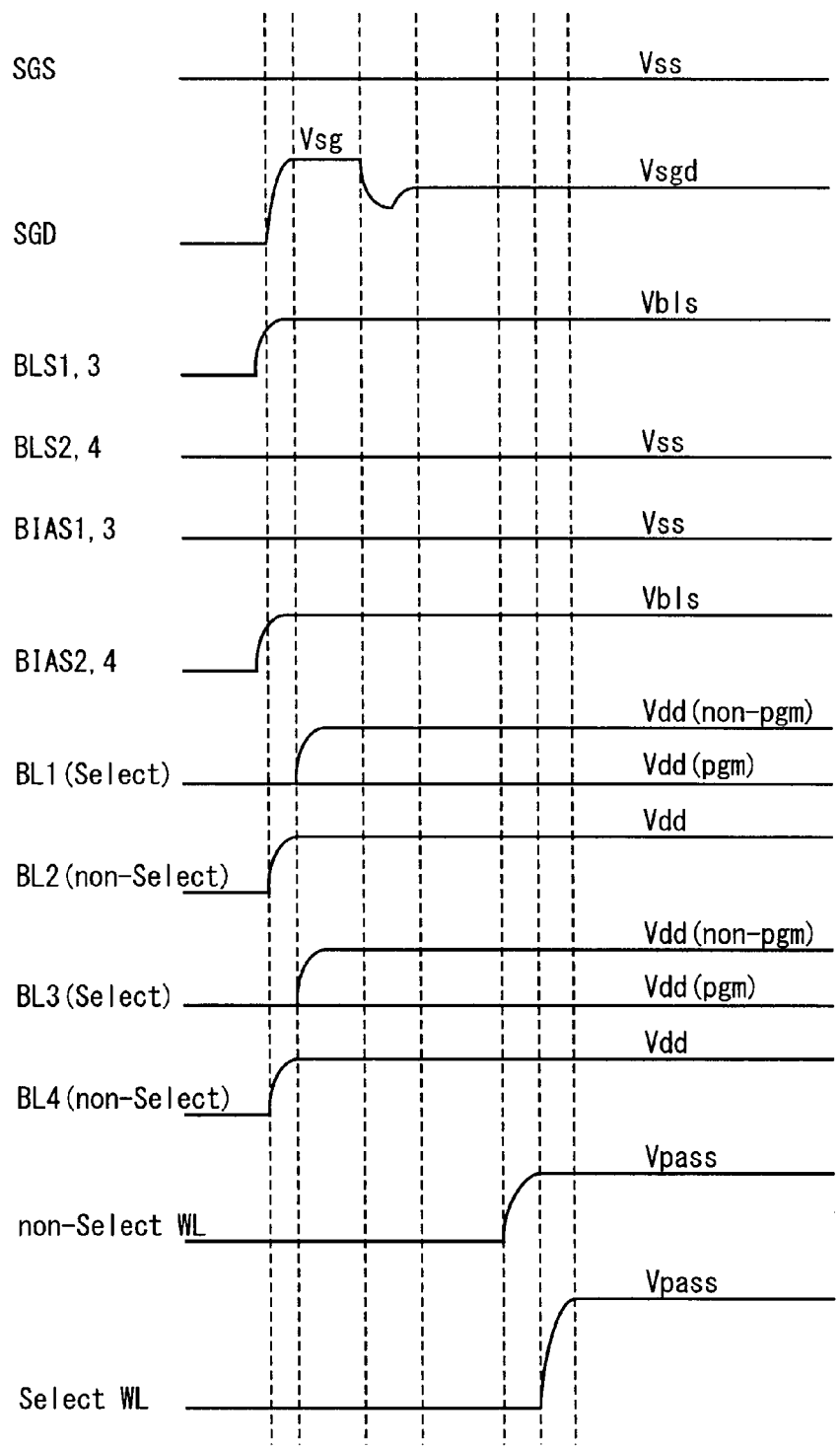
FIG. 4 is a waveform chart showing an operation of the even/odd programming in the embodiment.

That is, as in operation waveforms shown in FIG. 4, the bit line selection transistors BLS1 and BLS3 are turned on, BLS2 and BLS4 are turned off, a voltage Vsgd is applied to SGD, and thereafter data are programmed into cells connected to the bit lines BL1 and BL3 by applying a program voltage Vpgm to a selected word line.

At this point, the voltage BLCRL (Vdd) is supplied to non-selected bit lines BL2 and BL4 by turning on the bias transistors BIAS2 and BIAS4. For this reason, cells connected to the non-selected bit line BL2 and BL4 are not programmed.

Then, data are programmed into cells connected to the bit lines BL2 and BL4 by turning on the bit line selection transistors BLS2 and BLS4 and turning off BLS1 and BLS3.

Figure 5:
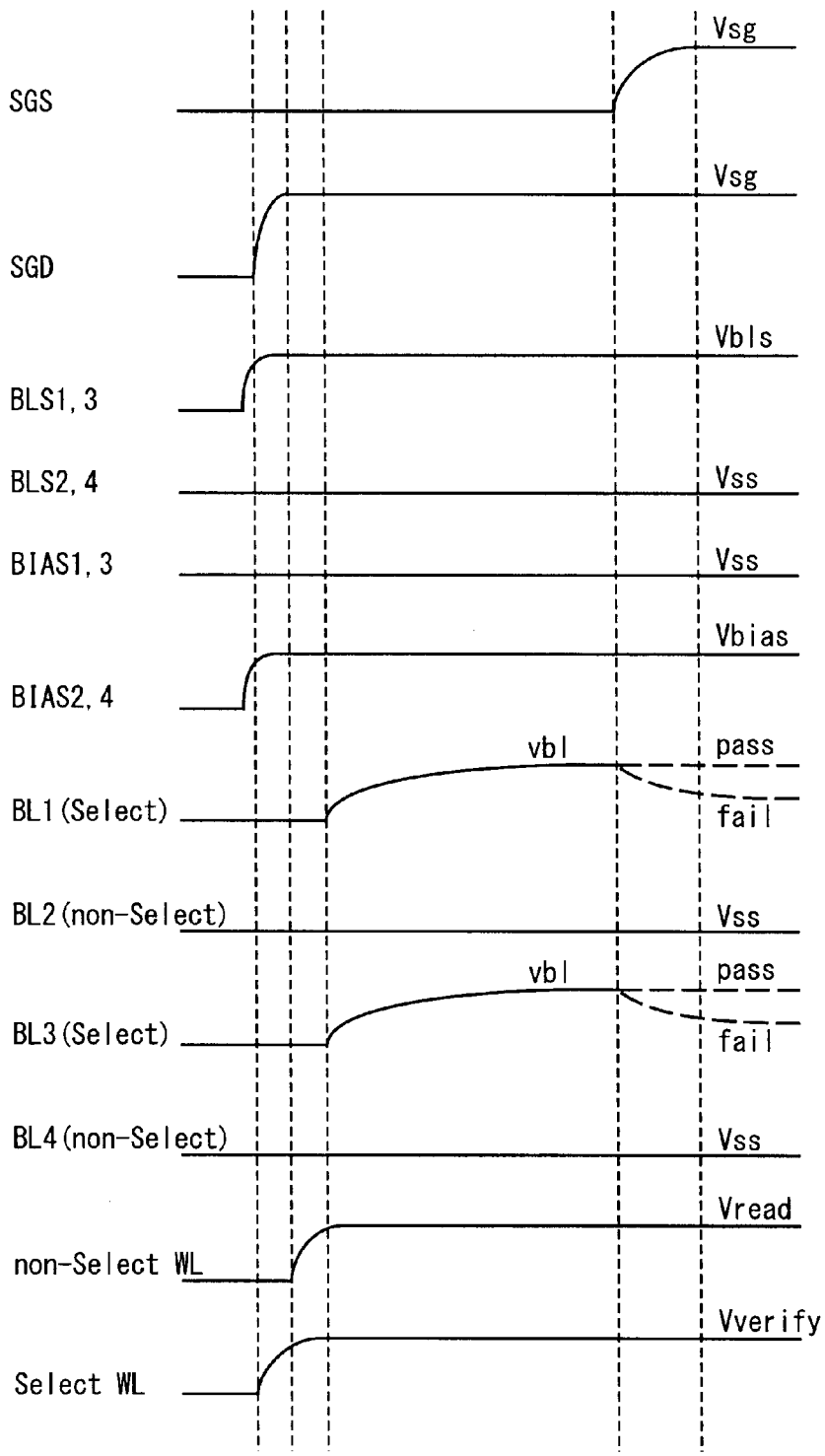
FIG. 5 is a waveform chart showing a verify operation of the even/odd programming in the embodiment.

Next, verify operations are carried out in accordance with operation waveforms shown in FIG. 5.

First, cells connected to the bit lines BL1 and BL3 are verified by turning on the bit line selection transistors BLS1 and BLS3, turning off BLS2 and BLS4 and applying a verify voltage Vverify to the selected word line WL.

At this point, the voltage BLCRL (Vss) is supplied to the non-selected bit lines BL2 and BL4 by turning on the bias transistor BIAS2 and BIAS4. For this reason, the cells connected to the non-selected bit lines BL2 and BL4 are not verified.

Next, the cells connected to the bit lines BL2 and BL4 are verified by turning on the bit line selection transistors BLS2 and BLS4 and turning off BLS1 and BLS3.

In the case of the even/odd programming and verification thereof, the same bit lines are connected to the sense amplifier in the programming and the verification. As has been stated above, programmed data for the bit line BL1 is held in the latch circuit LDL of the latch circuit group 2b of the data memory circuit 10_1 shown in FIG. 2, and programmed data for the bit line BL4 is held in the latch circuit LDL of the latch circuit group 2c. Furthermore, programmed data for the bit line BL3 is latched in the latch circuit LDL of the latch circuit group 2b of the data memory circuit 10_2, and programmed data for the bit line BL2 is held in the latch circuit LDL of the latch circuit group 2c of the data memory circuit 10_2. At the time of the verification, data read from respective bit lines are operated with the data held in the corresponding latch circuit groups, and thereby it is determined whether the programming is completed. As a result, when the programming is not completed, the programming voltage is stepped up and the programming operation is repeated.

On the other hand, in the pair programming shown in FIG. 3B, cells connected to the bit lines BL1 and BL2 are programmed first, and then cells connected to the bit lines BL3 and BL4 are programmed.

Figure 6:
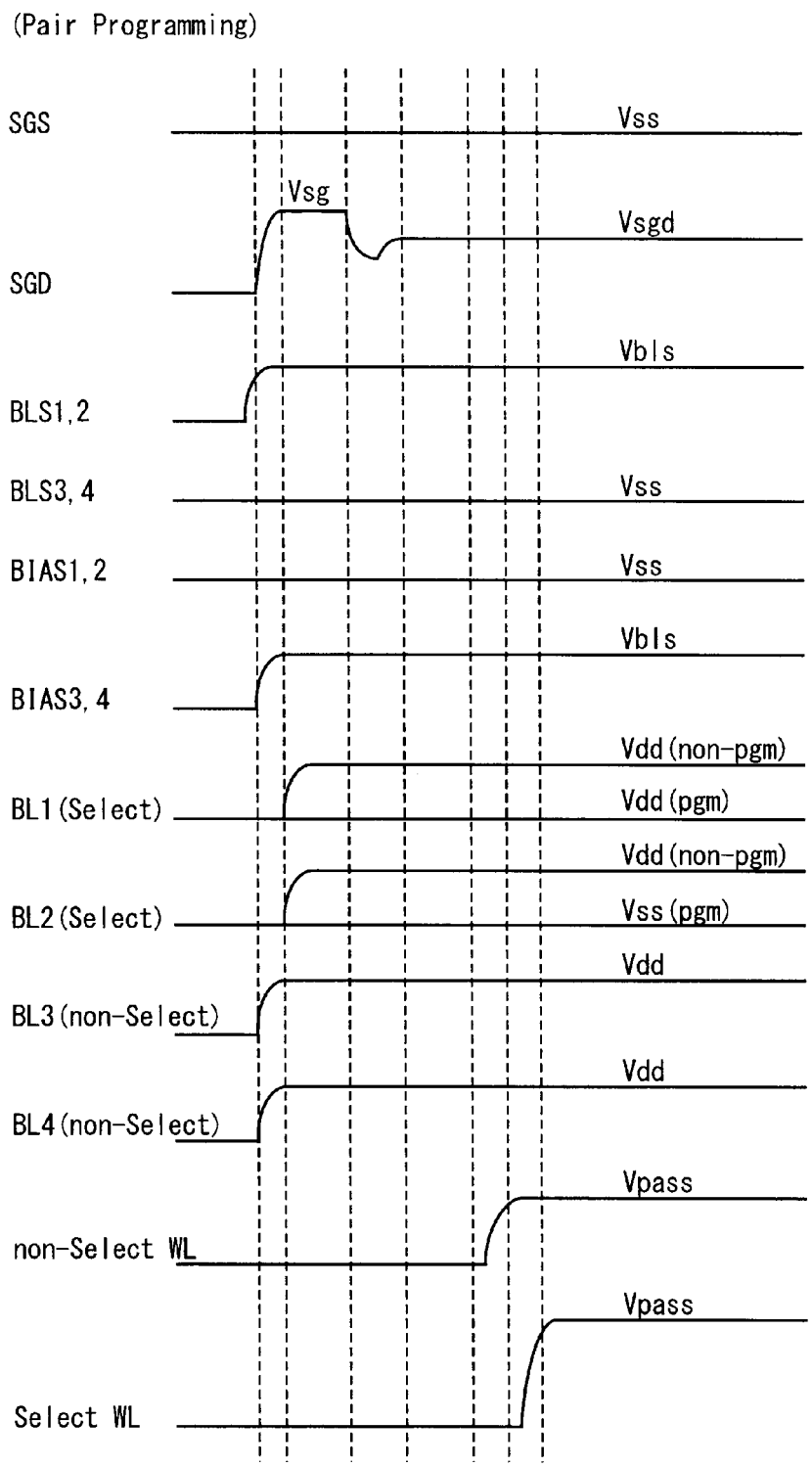
FIG. 6 is a waveform chart showing an operation of the pair programming in the embodiment.

That is, as shown in the operation waveforms shown in FIG. 6, first the bit line selection transistors BLS1 and BLS2 are turned on, BLS3 and BLS4 are turned off, voltage Vsgd is applied to SGD, and thereafter data are programmed into cells connected to the bit lines BL1 and BL2 by applying the programming voltage Vpgm to a selected word line WL. At this point, BLCRL=Vdd is supplied to non-selected bit lines BL3 and BL4 by turning on the bias transistors BIAS3 and BIAS4. For this reason, the non-selected bit line BL3 and BL4 are brought into a non-programming state.

Next, data are programmed into cells connected to the bit lines BL3 and BL4 by turning on the bit line selection transistors BLS3 and BLS4 and turning off BLS1 and BLS2.

Figure 7:
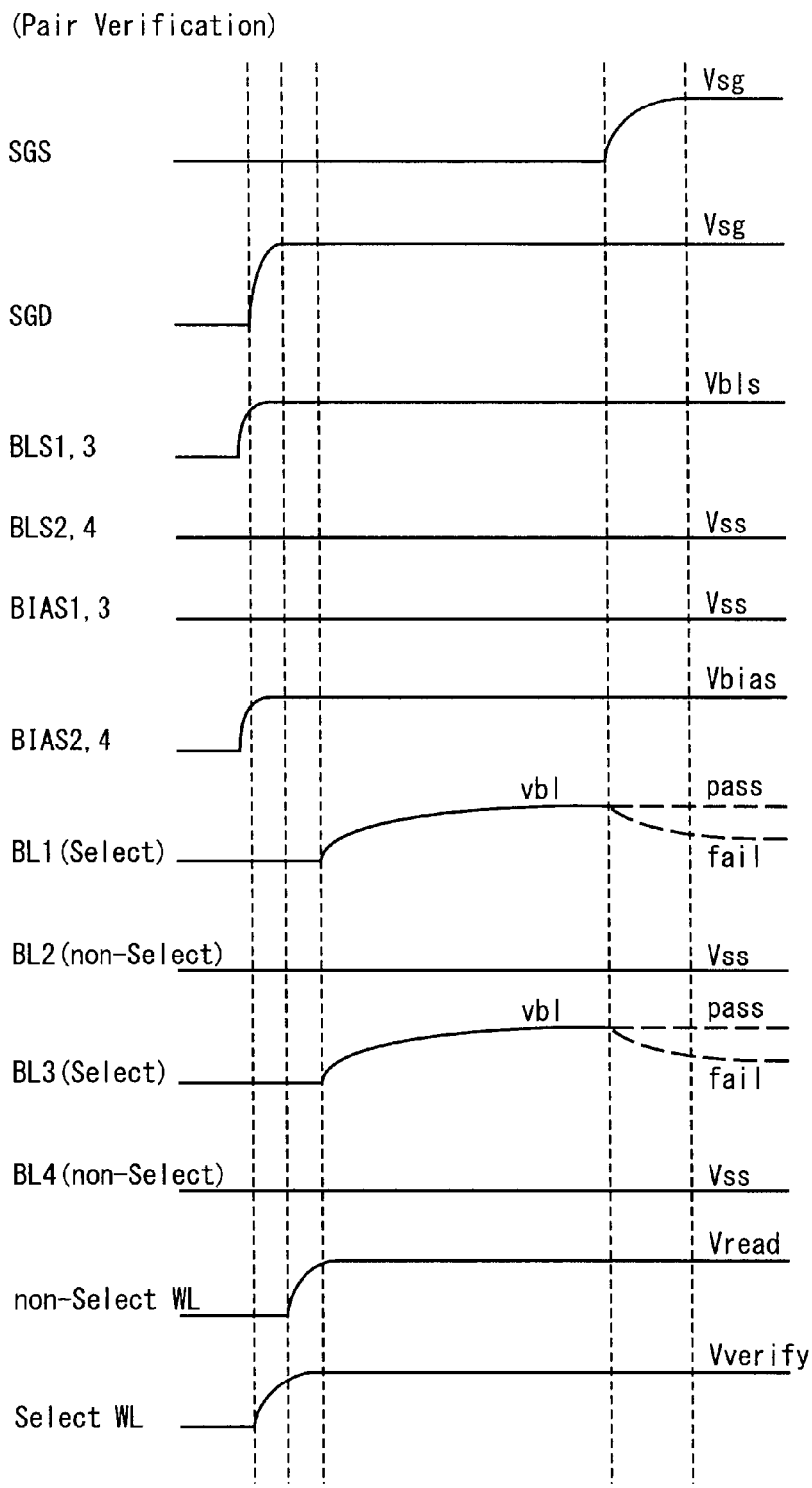
FIG. 7 is a waveform chart showing a verify operation of the pair programming in the embodiment.

Then, a verify operation is carried out in accordance with operation waveforms show in FIG. 7. The verify operation of the pair programming is carried out under a connection relationship between the bit line and the sense amplifier in the even/odd programming in order to shield adjoining cells.

First, cells connected to the bit lines BL1 and BL3 are verified by turning on the bit line selection transistors BLS1 and BLS3, turning off BLS2 and BLS4, and applying the verify voltage Vverify to the selected word line WL.

At this point, BLCRL=Vss is supplied to the non-selected bit lines BL2 and BL4 by turning on the bias transistors BIAS2 and BIAS4. For this reason, cells connected to the non-selected bit lines BL2 and BL4 are not verified.

Next, the cells connected to the bit line BL2 and BL4 are verified by turning on the bit line selection transistors BLS2 and BLS4 and turning off BLS1 and BLS3.

As mentioned above, in the case of the pair programming and the verification thereof, different bit lines are connected to the sense amplifiers in the programming and the verification. As has been stated above, however, since programmed data is held in the latch circuit LDL of each of the latch circuit groups 2b, 2c, it can be determined whether the programming is completed or not by comparing the data with data read from a corresponding bit line. As a result, when the programming is not completed, the programming voltage is stepped up and the programming operation is repeated.

Next, switching between the even/odd programming and the pair programming will be explained.

At the time of programming, a cell to be programmed has two problems of over programming due to coupling with adjoining cells and of erroneous programming due to insufficient boosts of cells not to be programmed.

Figure 8:
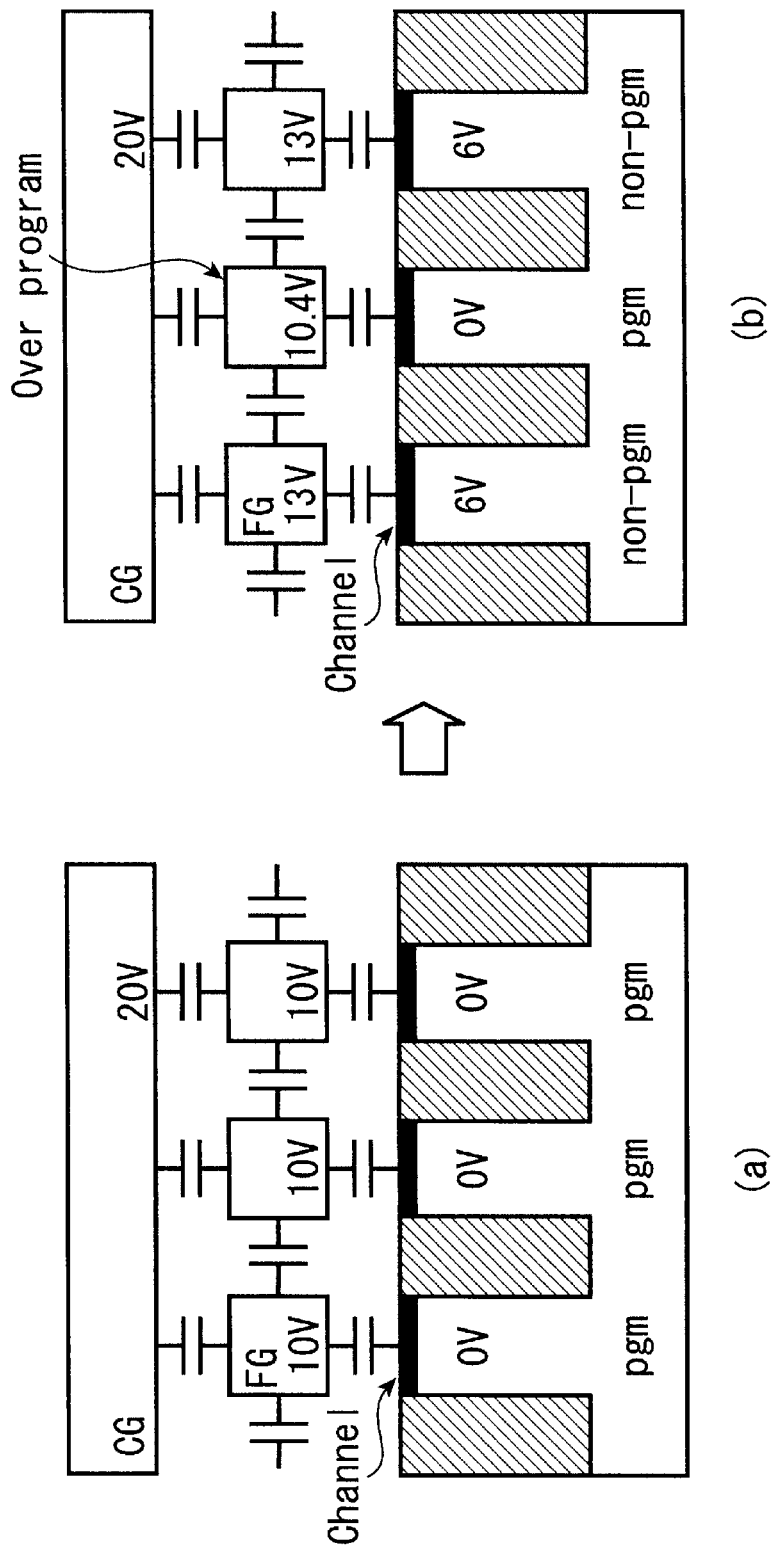
FIG. 8A and FIG. 8B are views showing one example of a programming operation causing over programming.

FIGS. 8A and 8B show situations of the over programming mentioned above. FIG. 8A shows the situation at the time of programming of three cells connected to a selected word line. Then, as shown in FIG. 8B, when cells adjoining on both sides to the cell to be programmed are programmed and are brought into a state not to be programmed, electric potentials of floating gates of the adjoining cells rise, for example, from 10V to 13V. For this reason, an electric field between a channel and the floating gate of the cell to be programmed increases by coupling, an equivalent state in which the programming voltage Vpgm is increased is caused, and the over programming is caused. In order not to be influenced by the changes from the state to be programmed to the state not to be programmed of the adjoining cells, it is necessary to shield the adjoining cells by the even/odd programming.

Figure 9:
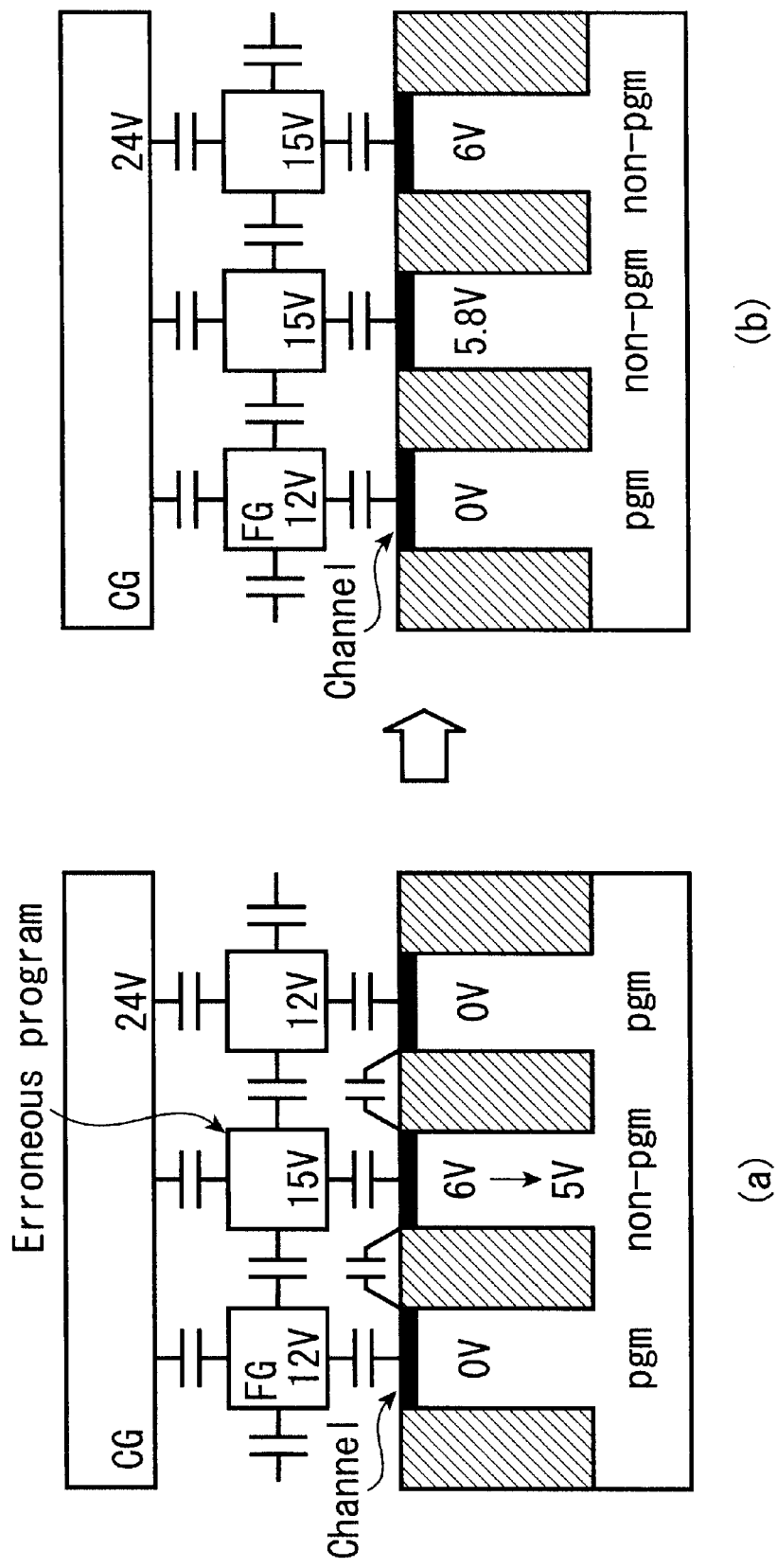
FIG. 9A and FIG. 9B are views showing one example of a programming operation causing erroneous programming.

On the other hand, FIGS. 9A and 9B show the situation of the erroneous programming and non-programming due to the insufficient boost of a cell not to be programmed.

As shown in FIG. 9A, when cells adjoining on both sides to the cell not to be programmed are in a state to be programmed, a channel electric potential of the cell not to be programmed falls, for example, from 6V to 5V by coupling. For this reason, a boost voltage of the channel is insufficient, the programming voltage Vpgm increases equivalently, and the cell not to be programmed is erroneously programmed.

As measures against this erroneous programming, it is possible to compensate the insufficient boost and to reduce an occurrence frequency of the erroneous programming by setting at least a cell one side of the cell not to be programmed always in a state not to be programmed using the pair programming, as shown in FIG. 9B.

Therefore, this embodiment can prevent the over programming of the cell to be programmed and the erroneous programming of the cell not to be programmed by switching the pair programming and the even/odd programming.

The erroneous programming of the cell not to be programmed due to the insufficient boost occurs frequently in a state of a high programming voltage Vpgm, and the over programming of the cell to be programmed occurs frequently in a state of a low programming voltage Vpgm. For this reason, switching timing of the pair programming and the even/odd programming is specified by a loop count of the programming. That is, the programming operation raises the threshold voltage of the cell to be programmed by applying the programming voltage Vpgm to the cell, and whether the threshold voltage of the cell has reached a predetermined level is determined by the verify operation. As a result, when the threshold voltage of the cell does not reach the predetermined level, the programming is carried out again after stepping up the programming voltage Vpgm by ?Vpgm. These programming, verification and step-up of the programming voltage are repeated until the threshold voltage of the cell reaches the predetermined level. In this embodiment, the pair programming and the even/odd programming is switched in accordance with the loop count of the repetition.

Figure 10:
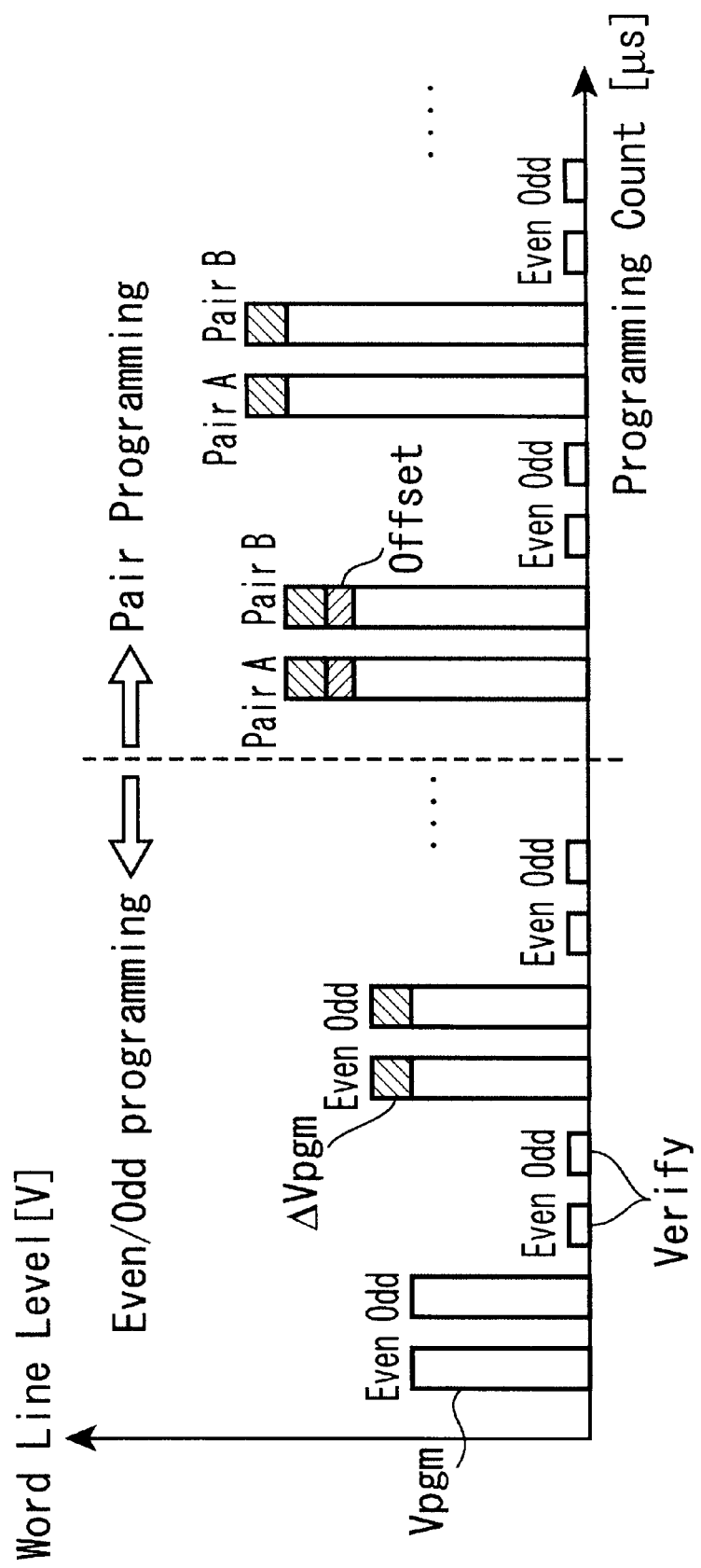
FIG. 10 is a view showing one example of a programming operation in the embodiment.

FIG. 10 shows a relationship between the programming count (the loop count) and the level of the word line (the programming voltage).

As shown in FIG. 10, the even/odd programming is carried out in order to prevent the over programming due to the coupling between a cell to be programmed and adjoining cells in an initial stage of the programming with a small programming count. Then, when the programming count increases and reaches the programming count at which the problem of the erroneous programming due to the insufficient boost of the cell not to be programmed becomes remarkable, the even/odd programming is switched to the pair programming. That is, when the programming count reaches a specific value, the even/odd programming is switched to the pair programming.

When switched to the pair programming, an influence of the coupling is caused depending on the programming state of a memory cell connected to an adjoining bit line. For this reason, not only the step-up voltage ?Vpgm is merely added to the programming voltage Vpgm but also an offset voltage is added to the step-up voltage ?Vpgm. This offset voltage has a positive or negative value, and is set depending on the influence of the coupling.

Specifically, when, for example, a cell adjoining to a cell to be programmed changes from a state not to be programmed to a state to be programmed after the even/odd programming is switched to the pair programming, an electric potential of a floating gate of the adjoining cell falls and also an electric potential of a floating gate of the cell to be programmed falls by coupling. For this reason, a positive offset voltage is required.

On the other hand, when a cell adjoining to the cell to be programmed is in a state not to be programmed, the erroneous programming due to the insufficient boost of the cell not to be programmed is caused as has been stated above. The programming voltage Vpgm had better be low in order to prevent this. Accordingly, a negative offset is required. In this case, however, a circuit generating a negative voltage is required, and thus, for example, a value of the step-up voltage ?Vpgm is reduced. Incidentally, the offset voltage is set, for example, for each product.

In addition, an address at the time of the verification changes depending on whether the programming has been carried out by the pair programming or has been carried out by the even/odd programming. For this reason, when the even/odd programming is switched to the pair programming at the specific loop count, an address in the verification is also changed.

On the other hand, when data programmed into a memory cell as above is read, a bit line and a sense amplifier can be connected, for example, as in the even/odd bit line programming. That is, in the case of the even/odd bit line programming, for example, a reading operation is carried out in a state in which the bit lines BL1, BL3 and the sense amplifiers 2a of the data memory circuits 10_1, 10_2 are connected, and then a reading operation is carried out in a state in which the bit lines BL2, BL4 and the sense amplifiers 2a of the data memory circuits 10_1, 10_2 are connected. The data detected by each sense amplifier 2a is held in the latch circuit XDL. The data in this latch circuit XDL is selected by the column decoder 3 operating in accordance with a column address, and is outputted.

In addition, the latch circuit groups 2b, 2c are connected to the sense amplifier 2a in parallel. For this reason, a reading speed can be accelerated by adopting an operation in which data read, for example, into an even bit line is held in the latch circuit XDL of the latch circuit group 2b, data read into an odd bit line is held in the latch circuit XDL of the latch circuit group 2c while the data held in the latch circuit XDL of the latch circuit group 2b is being outputted, and data read into the even bit line is held in the latch circuit XDL of the latch circuit group 2b while the data held in the latch circuit XDL of the latch circuit group 2c is being outputted.

According to the embodiment mentioned above, the bit line selection transistors are provided, the even/odd programming and the pair programming can be switched, and the even/odd programming and the pair programming are switched based on the loop count of the programming. For this reason, the over programming due to the coupling between a cell to be programmed and an adjoining cell can be prevented, and the erroneous programming due to the insufficient boost of the cell not to be programmed can be prevented.

In addition, the even/odd programming and the pair programming can be carried out by switching bit lines connected to a sense amplifier. For this reason, it is not necessary to dispose a sense amplifier at each bit line as before, and thus an expansion of a circuit scale can be prevented, and an expansion of a chip area can be suppressed.

The embodiment mentioned above has been explained about a case where a binary (1 bit) data is memorized in a memory cell, but can similarly be carried out also in the case where two bit (quaternary) or more data is memorized.

The invention is not limited to the embodiment mentioned above, but of course can be carried out in various modified ways within a scope not changing the spirit of the invention.

What is claimed is:

1. A nonvolatile semiconductor memory device comprising:
   a memory cell array including memory cells connected to plural word lines and plural bit lines, the plural bit lines including a first bit line, a second bit line, a third bit line, and a fourth bit line, the first bit line to the fourth bit line being adjacent to each other, the second bit line being arranged between the first bit line and the third bit line, the third bit line being arranged between the second bit line and the fourth bit line;
   sense amplifiers connected to the bit lines, the sense amplifiers including a first sense amplifier and a second sense amplifier;
   a first transistor arranged between the first bit line and the first sense amplifier;
   a second transistor arranged between the second bit line and the second sense amplifier;

a third transistor arranged between the third bit line and the second sense amplifier; and a fourth transistor arranged between the fourth bit line and the first sense amplifier, wherein the first sense amplifier is connectable to the first bit line via the first transistor or to the fourth bit line via the fourth transistor, and the second sense amplifier is connectable to the second bit line via the second transistor or to the third bit line via the third transistor.

2. The semiconductor memory device according to claim 1 further comprising:

a control circuit configured to switch an even/odd programming which connects the first and the third bit lines to the first and the second sense amplifiers, and connects the second and the fourth bit lines to the first and the second sense amplifiers, and a pair programming which connects the first and the second bit lines to the first and the second sense amplifiers, and connects the third and the fourth bit lines to the first and the second sense amplifiers, by controlling the first to the fourth selection transistors.

3. The Semiconductor memory device according to claim 2 wherein the control circuit programs data into the memory cell by the even/odd programming in an initial period of a programming operation, and programs data into the memory cell by the pair programming when a programming count exceeds a specific value.

4. The semiconductor memory device according to claim 3 wherein, when programming is verified, the control circuit sets a connection of the first to the fourth bit lines and the first and the second sense amplifiers as in the even/odd programming by controlling the first to the fourth selection transistors.

5. The semiconductor memory device according to claim 1 wherein, when data is read from the memory cell, the control circuit sets a connection of the first to the fourth bit lines and the first and the second sense amplifiers as in the even/odd programming by controlling the first to the fourth selection transistors.

6. The semiconductor memory device according to claim 5 wherein, when data is read, the control circuit reads the data from the memory cell by connecting the first and the third bit lines to the first and the second sense amplifiers by turning the first and the third selection transistors on, and reads the data from the memory cell by connecting the second and the fourth bit lines to the first and the second sense amplifiers by turning the second and the fourth selection transistors on.

7. The semiconductor memory device according to claim 1 further comprising a first and a second latch circuit groups connected in parallel to the first and the second sense amplifiers, respectively, wherein the first and the second latch circuit groups are each configured with plural latch circuits.

8. The semiconductor memory device according to claim 2 further comprising a first and a second latch circuit groups connected in parallel to the first and the second sense amplifiers, respectively, wherein the first and the second latch circuit groups are each configured with plural latch circuits.

9. The semiconductor memory device according to claim 3 further comprising a first and a second latch circuit groups connected in parallel to the first and the second sense amplifiers, respectively, wherein the first and the second latch circuit groups are each configured with plural latch circuits.

10. The semiconductor memory device according to claim 4 further comprising a first and a second latch circuit groups connected in parallel to the first and the second sense amplifiers, respectively, wherein the first and the second latch circuit groups are each configured with plural latch circuits.

11. The semiconductor memory device according to claim 5 further comprising a first and a second latch circuit groups connected in parallel to the first and the second sense amplifiers, respectively, wherein the first and the second latch circuit groups are each configured with plural latch circuits.

12. The semiconductor memory device according to claim 6 further comprising a first and a second latch circuit groups connected in parallel to the first and the second sense amplifiers, respectively, wherein the first and the second latch circuit groups are each configured with plural latch circuits.

13. The semiconductor memory device according to claims 2 wherein, when data is read from the memory cell, the control circuit sets a connection of the first to the fourth bit lines and the first and the second sense amplifiers as in the even/odd programming by controlling the first to the fourth selection transistors.

14. The semiconductor memory device according to claims 3 wherein, when data is read from the memory cell, the control circuit sets a connection of the first to the fourth bit lines and the first and the second sense amplifiers as in the even/odd programming by controlling the first to the fourth selection transistors.

15. The semiconductor memory device according to claims 4 wherein, when data is read from the memory cell, the control circuit sets a connection of the first to the fourth bit lines and the first and the second sense amplifiers as in the even/odd programming by controlling the first to the fourth selection transistors.

16. A nonvolatile semiconductor memory device comprising:

a memory cell array including memory cells connected to plural word lines and plural bit lines, the plural bit lines including first even bit line, second even bit line, first odd bit line, and second odd bit line;

a controller configured to apply a first program voltage to selected word line on the condition that both first even bit line and the second even bit line are selected, the controller being configured to apply a second program voltage to selected word line on the condition that both first odd bit line and the second odd bit line are selected, the controller being configured to a third voltage to selected word line on the condition that adjacent bit lines selected from the plural bit lines are selected.

17. The semiconductor memory device according to claim 16 further comprising:

sense amplifiers connected to the plural bit lines, the sense amplifiers including a first sense amplifier and a second sense amplifier, the first sense amplifier being capable of connecting the first odd bit line or the second even bit line, the second amplifier being capable of connecting the first even bit line or the second odd bit line.

18. The semiconductor memory device according to claim 16 further comprising:

a first transistor arranged between the first bit line and the first sense amplifier;

a second transistor arranged between the second bit line and the second sense amplifier;

a third transistor arranged between the third bit line and the second sense amplifier; and a fourth transistor arranged between the fourth bit line and the first sense amplifier.

\* \* \* \* \*